United States Patent
Huang et al.

(10) Patent No.: US 10,099,182 B2
(45) Date of Patent: Oct. 16, 2018

(54) WATER-PROOF AND DUST-PROOF MEMBRANE ASSEMBLY AND APPLICATIONS THEREOF

(75) Inventors: James Huang, Zhongli (TW); Sean Chen, Zhongli (TW); Radium Huang, Zhongli (TW); Jeff Han, Zhongli (TW)

(73) Assignee: EF-MATERIALS INDUSTRIES INC., Zhongli (TW)

( * ) Notice: Subject to any disclaimer, the term of this patent is extended or adjusted under 35 U.S.C. 154(b) by 0 days.

(21) Appl. No.: 12/842,193

(22) Filed: Jul. 23, 2010

(65) Prior Publication Data

US 2011/0188247 A1   Aug. 4, 2011

Related U.S. Application Data

(63) Continuation-in-part of application No. 12/732,571, filed on Mar. 26, 2010, now Pat. No. 8,530,004.

(30) Foreign Application Priority Data

Feb. 2, 2010   (TW) .............................. 099102950 A (51) Int. Cl.
  *B01D 69/02*   (2006.01)
  *B01D 39/16*   (2006.01)
  (Continued)

(52) U.S. Cl.
  CPC ......... *B01D 69/02* (2013.01); *B01D 39/1692* (2013.01); *B01D 61/32* (2013.01);
  (Continued)

(58) Field of Classification Search
  None
  See application file for complete search history.

(56) References Cited

U.S. PATENT DOCUMENTS 4,636,424 A * 1/1987 Amemiya et al. ............ 428/198
4,877,433 A   10/1989 Oshitari
(Continued)

FOREIGN PATENT DOCUMENTS

| CN | 1453422 A | * 11/2003 | ............... D06N 7/07 |
| JP | 2001168543 A | * 6/2001 | ............... H05K 5/02 |
| JP | 2005179441 A | * 7/2005 | |
| JP | 2005334758 A | * 12/2005 | ............. B01D 39/16 |

OTHER PUBLICATIONS

Masuko H. et al., Ventilation Enclosure, Jun. 22, 2001, machine translation of JP2001168543A.*
(Continued)

*Primary Examiner* — Chinessa T. Golden
(74) *Attorney, Agent, or Firm* — Rahman LLC (57) ABSTRACT

Disclosed is a water-proof and dust-proof membrane assembly and applications thereof. The water-proof and dust-proof membrane assembly comprises a body and a supporting member. The body is of membrane and has a first surface, a second surface, and an asymmetric porous structure formed between the first surface and the second surface of the body. The asymmetric porous structure has a thickness ranging between 1 μm and 1000 μm, a first volumetric porosity ranging between 5% and 99%. The asymmetric porous structure has plural pores, and each pore has a pore diameter between 0.01 μm and 15 μm. The supporting member is of a polymeric material and has a first contacting surface, a second contacting surface, and a second volumetric porosity which is greater than the first volumetric porosity. The first contacting surface of the supporting member is adhered to the first surface of the body.

3 Claims, 7 Drawing Sheets

(51) Int. Cl.
- *B01D 61/32* (2006.01)
- *B01D 69/10* (2006.01)
- *B01D 71/26* (2006.01)
- *B01D 71/36* (2006.01)
- *F21S 4/00* (2016.01)
- *H05K 5/03* (2006.01)
- *B29K 105/04* (2006.01)
- *B29L 31/00* (2006.01)

(52) U.S. Cl.
CPC ............. *B01D 69/10* (2013.01); *B01D 71/26* (2013.01); *B01D 71/36* (2013.01); *F21S 4/00* (2013.01); *H05K 5/03* (2013.01); *B01D 2239/0654* (2013.01); *B01D 2239/1216* (2013.01); *B01D 2239/1291* (2013.01); *B01D 2325/02* (2013.01); *B01D 2325/022* (2013.01); *B01D 2325/04* (2013.01); *B01D 2325/20* (2013.01); *B01D 2325/38* (2013.01); *B29K 2105/045* (2013.01); *B29L 2031/755* (2013.01)

(56) References Cited

U.S. PATENT DOCUMENTS

| | | | |
|---|---|---|---|
| 5,013,339 A * | 5/1991 | Mahoney et al. | 210/500.23 |
| 2002/0189455 A1* | 12/2002 | Lamon | B01D 53/228 96/12 |
| 2003/0077435 A1* | 4/2003 | Charkoudian et al. | 428/304.4 |
| 2003/0089660 A1* | 5/2003 | Huang et al. | 210/500.36 |
| 2003/0192826 A1* | 10/2003 | Wang et al. | 210/500.21 |
| 2004/0195173 A1* | 10/2004 | Huang et al. | 210/490 |

OTHER PUBLICATIONS

Yu Y., Making Process and Special Apparatus for Hydrophobic Permeable Facing Material With Covered Film, Nov. 5, 2003, machine translation of CN1453422A.*

Yanagi T., Ventilation Filter, Dec. 8, 2005, machine translation of JP2005334758A.*

Urairi, Masakatsu et al., Highly Water Repellent Structure, Jul. 7, 2005, machine translation of JP2005-179441.*

* cited by examiner

WATER-PROOF AND DUST-PROOF MEMBRANE ASSEMBLY AND APPLICATIONS THEREOF

The current application is a continuation-in-part of U.S. Ser. No. 12/732,571, filed Mar. 26, 2010 now U.S. Pat. No. 8,530,004, and claims priorities to the following foreign and U.S. applications.
1. Taiwan, application number 099102950, filed on Feb. 2, 2010
2. U.S. Ser. No. 12/732,571, filed on Mar. 26, 2010

BACKGROUND OF THE INVENTION

1. Technical Field

The present invention relates to water-proof and dust-proof membranes, and more particularly to a water-proof and dust-proof membrane assembly that has a supporting member.

2. Description of Related Art

Technical developments improve the quality of human life and make the electronic products essentials to human life. Consumer electronic products, such as cell phones, digital cameras, laptop computers, MP3s, MP4s, and PDAs, or general outdoor electric appliances, such as security monitoring systems, outdoor lamps, traffic lights, underwater electric appliances, marine electric appliances, telecommunication devices and medical electronic devices.

Housings of diverse outdoor electronic products are always subjected to temperature variation, weather corrosion and solar radiation. Also, sudden drop of the ambient temperature would cause unbalanced air pressure in the housing, hence making the air or the moisture enter the housing, and therefore making the electronic circuits, which are sensitive to the air and the moisture, in the housing breakdown due to the corrosion. In addition, those existing consumer electronic products which lack the water-proof and dust-proof capabilities, when splashed by drinks or other liquids accidentally or when frequently used, are likely to get damaged because of the liquids or dust entering into the electronic circuit thereof. Hence, the related manufacturers have paid much attention to continuously improve the existing electronic products in practicability and duration.

For prolonging the service life of electronic products, one major factor is to maintain the internal electronic circuits working normally. To ensure the sensitivity of electronic products, and to secure normal operation of their internal electronic circuit, so as to endow the electronic products with prolonged service life, factors including water-proof capability, dust-proof capability, corrosion resistance and air-permeability have to be thoroughly considered so as to enable the electronic products to remain good operation even in adverse circumstances.

Currently, it is common to use a porous film as a protective membrane. Specifically, most porous films are typically made of fluorinated polymeric material, e.g. fluoropolymers, fluorinated ethylene-propylene (FEP), polytetrafluoroethylene (PTFE) and polyvinylidene fluoride (PVDF), etc.

The PTFE porous film has excellent water repellency at its surface and possess a water contact angle of 118°, being the largest among the above-mentioned materials, so it is unlikely to be wetted by general liquids and unlikely to adhere to other materials. Through disclosed process (for example see U.S. Pat. Nos. 3,953,566, 3,962,153, and 4,902,423) for preparing a PTFE porous film, the PTFE porous film can be made into a porous film with 1 billion to 15 billion micro-pores per square inch, having excellent air-permeability. Furthermore, the micro-pores of the above-mentioned PTFE porous film have an average pore diameter of 0.25 to 0.55 μm, which is only one ten-thousandth as large as a rain drop, yet is 700 times larger than a sweat drop or a vapor particle, so the PTFE porous film is advantageous as being an air permeable and water-proof film.

The internal network structure formed with the microfibers of the PTFE porous film is in nature heat resistant and surface lubricative, and accordingly allows the dust absorbed at its surface to be easily removed. The above-mentioned PTFE porous film can be made with different pore sizes and laminated with various fabrics for applications of materials where dust-proof capability is required. Thus, the PTFE porous film is useful for dust-proof and filtering purposes.

Such a protective membrane made of a PTFE porous film that is water-proof, sound-transmitting, dust-proof and air permeable, when being applied to different products, may have to provide different levels of water-proofness, sound transmittance as well as air-permeability. It is known that the water-proofness of the PTFE porous membrane is enhanced by reducing an average pore size. However, the water-proofness and the air-permeability usually compromise each other's performance, in short, the air-permeability and the water-proofness are in a trade-off relationship. In addition, the sound transmittance and the water-proofness are also in a trade-off relationship. To be brief, a reduced average pore size lowers the air-permeability as well as the sound transmittance. Accordingly, it is not easy to enhance the water-proofness without lowering the air-permeability and the sound transmittance. While there are many commercially available protective membrane products made of a PTFE porous film, one with high air-permeability and high sound transmittance must have a relatively large pore diameter, which suggest weakened water-proofness. On the other hand, one having relatively small pore diameter to present good water-proofness can often suffer from poor air-permeability and poor sound transmittance.

While the aforementioned common electronic products and water-proof electronic products that need a competent protective membrane made of a PTFE porous film for protecting the internal electronic circuits, many non-electronic products with special requirements related to water-proof capability and air-permeability are also in need of such protective membrane. Thus, how to make a protective membrane having satisfactory water-proofness, dust-proof capability, and air-permeability, and being widely adaptive to various products to provide protection and prolong the service life of the products is an issue to be addressed.

SUMMARY OF THE INVENTION

To overcome the shortcomings of the prior arts mentioned above, the present invention provides a water-proof and dust-proof membrane assembly, which comprises a body and a supporting member. The body is in form of membrane and has a first surface, a second surface and an asymmetric porous structure. The asymmetric porous structure is formed between the first surface and the second surface of the body. The asymmetric porous structure has a thickness ranging between 1 μm and 1000 μm, a first volumetric porosity ranging between 5% and 99%. In addition, the asymmetric porous structure has plural pores, and each pore of the asymmetric porous structure has a pore diameter between 0.01 μm and 15 μm. Furthermore, the supporting member is in form of a polymeric material and has a first contacting surface, a second contacting surface and a second volumetric porosity. Specifically, the first contacting surface of the supporting member is adhered to the first surface of the body. Moreover, the second volumetric porosity of the supporting member is greater than the first volumetric porosity of the body.

Accordingly, the primary object of the present invention is to provide a water-proof and dust-proof membrane assembly, which has satisfactory water-proof capability, dust-proof capability, sound transmittance capability as well as air-permeability while having superior supporting strength and pressure resistance.

Another objective of the present invention is to provide a water-proof and dust-proof membrane assembly, which has enhanced water-pressure resistance and thereby being adaptive to underwater products.

Yet another objective of the present invention is to provide an electronic device having the water-proof and dust-proof membrane assembly, wherein the electronic device has satisfactory water-proof capability, dust-proof capability, sound transmittance capability as well as air-permeability.

Still another objective of the present invention is to provide a lamp apparatus having the water-proof and dust-proof membrane assembly, wherein the lamp apparatus has satisfactory water-proof capability, dust-proof capability and air-permeability.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE INVENTION

Some particular features of the invention will be described in detail for purpose of illustration, and one of ordinary skill in the art can easily understand the advantages and efficacy of the present invention through the disclosure of the specification. It is to be understood that alternative embodiments may be possible for the implement and application of the present invention while numerous variations will be possible to the details disclosed in the specification on the strength of diverse concepts and applications without going outside the scope of the invention as disclosed in the claims.

Figure 1:
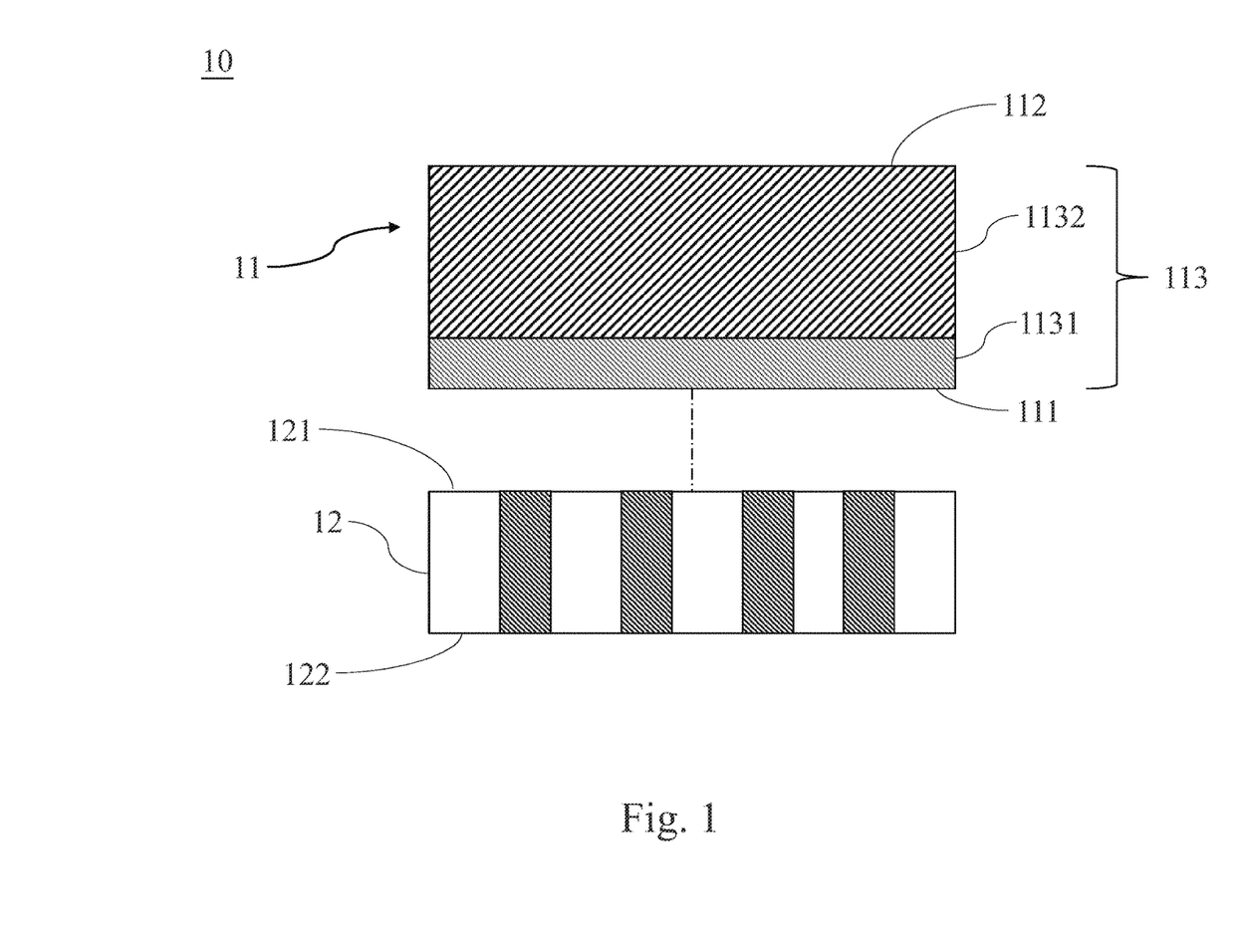
FIG. 1 is a cross-sectional view of a water-proof and dust-proof membrane assembly according to the first preferred embodiment of the present invention.

Please refer to FIG. 1. The first preferred embodiment of the present invention is a water-proof and dust-proof membrane assembly 10. The water-proof and dust-proof membrane assembly 10 comprises a body 11 and a supporting member 12. The body 11 is in form of membrane and has a first surface 111, a second surface 112 and an asymmetric porous structure 113. The asymmetric porous structure 113 is formed between the first surface 111 and the second surface 112 of the body 11.

The body 11 can be made of a resin porous film or a fluoropolymer film; however, the material for the body 11 is not particularly limited. Specifically, the resin porous film can be an ultra-high molecular weight polyethylene porous film or a polytetrafluoroethylene film. In addition, the fluoropolymer film can be made of a partially fluorinated polymer or a fully fluorinated polymer. Specifically, in this preferred embodiment, the body 11 is preferably made of expanded porous polytetrafluoroethylene. The body 11 is made through the process described hereinafter. The body 11 of this preferred embodiment is manufactured by mixing a suspension of polytetrafluoroethylene resin or a dispersion of polytetrafluoroethylene resin with at least one additive, and treating the above-mentioned resin by means of a stretching shaping method, thus obtaining the body 11 composed of expanded porous polytetrafluoroethylene. The aforementioned additive can be titanium dioxide, silicon dioxide, carbon black, nano carbon tube, inorganic oxide, or organic oxide, or a combination of the aforementioned materials. After being mixed with at least one additive, the suspension of polytetrafluoroethylene resin or the dispersion of polytetrafluoroethylene resin is serially processed by the aforementioned stretching shaping method, which including the molding step, the extruding step, the calendaring step, the expanding step, the heat-setting step and cooling step, thereby the body 11 composed of expanded porous polytetrafluoroethylene is obtained. After the body 11 composed of expanded porous polytetrafluoroethylene is obtained, the body 11 is further manufactured by heating one side (not shown) of the expanded porous polytetrafluoroethylene material which is homogeneous and porous, to a surface temperature higher than the melting point of the expanded porous polytetrafluoroethylene material; and rapidly cooling the other side (not shown) of the expanded porous polytetrafluoroethylene material; thereby the body 11 comprising a first surface 111, a second surface 112 and an asymmetric porous structure 113 is obtained, wherein the asymmetric porous structure 113 is formed between the first surface 111 and the second surface 112 of the body 11. The asymmetric porous structure 113 has a thickness ranging between 1 μm and 1000 μm, a first volumetric porosity ranging between 5% and 99%. In addition, the asymmetric porous structure 113 has plural pores (not shown), and each pore (not shown) of the asymmetric porous structure 113 has a pore diameter between 0.01 μm and 15 μm. Moreover, the asymmetric porous structure 113 comprises a dense portion 1131 and a normal portion 1132. Specifically, the dense portion 1131 is 0.04% to 40% of the thickness of the asymmetric porous structure 113 and the dense portion 1131 has a water contact angle ranging between 120° and 135°.

The asymmetric porous structure 113 of the body 11 composed of expanded porous polytetrafluoroethylene of this preferred embodiment has its air-permeability changed after processed by the aforementioned stretching shaping method. Since this asymmetric porous structure 113 is of a primary structure of the body 11, the body 11 is accordingly heat resistant, flame resistant, acid and alkali resistant, weather resistant, water repellent and oil repellent, while having its internal fabric binding nodes in all directions, so such body 11 made of expanded porous polytetrafluoroethylene is unlikely to present creep. The asymmetric porous structure 113 of the body 11 can have its pore diameter and first volumetric porosity adjusted with different applications, so as to satisfy the water-proof capability, the dust-proof capability, the sound transmittance capability as well as the air-permeability required by individual products. For achieving said end, while processing the body 11 composed of expanded porous polytetrafluoroethylene by the aforementioned stretching shaping method, the following factors, including stretching temperature, stretching speed, stretching ratio and so on, can be controlled, thereby controlling the pore diameter of the asymmetric porous structure 113, and in turn improving the first volumetric porosity and the uniformity of the asymmetric porous structure 113.

Furthermore, the supporting member 12 is in form of a polymeric material and has a first contacting surface 121, a second contacting surface 122 and a second volumetric porosity. Specifically, the first contacting surface 121 of the supporting member 12 is adhered to the first surface 111 of the body 11. Particularly, when the first contacting surface 121 of the supporting member 12 is adhered to the first surface 111 of the body 11, wherein the first surface 111 of the body 11 is on the dense portion 1131 of the asymmetric porous structure 113, the water-proof and dust-proof membrane assembly 10 has a water-proofness value ranging between 1500 and 8000 mmH$_2$O and has an air-permeability value ranging between 0.4 and 5.8 cm$^3$/cm$^2$ sec. In addition, such water-proof and dust-proof membrane assembly 10 has Gurley number value ranging between 0.15 and 12.3.

Moreover, the second volumetric porosity of the supporting member 12 is greater than the first volumetric porosity of the body 11. Since the body 11 is in form of a membrane as stated above, by having the first contacting surface 121 of the supporting member 12 adhered to the first surface 111 of the body 11, the supporting member 12 reinforces the overall supporting strength and pressure resistance of the water-proof and dust-proof membrane assembly 10. In addition, the supporting member 12 has a second volumetric porosity ranging between 10% and 99.9%, which is subject to the first volumetric porosity of the body 11 to the extent that the combination of the second volumetric porosity of the supporting member 12 and the first volumetric porosity of the body 11 does not affect the body 11 in the water-proof capability, the dust-proof capability, the sound transmittance capability, the air-permeability as well as the water pressure resistance.

The material for the supporting member 12 is not particularly limited. In this preferred embodiment, the supporting member 12 can be made of a polymeric material, such as polyester resin, polyethylene resin or aromatic polyamide resin. Besides, the form for the supporting member 12 is not particularly limited. In this preferred embodiment, the supporting member 12 can be in form of fabric, non-woven, mesh, net, sponge, foam or a porous medium.

Since the second volumetric porosity of the supporting member 12 is greater than the first volumetric porosity of the body 11, the supporting member 12 serves to enhance the supporting strength and water pressure resistance of the water-proof and dust-proof membrane assembly 10 without affecting the water-proof capability, the dust-proof capability, the sound transmittance capability, the air-permeability provided by the asymmetric porous structure 113 of the body 11.

Particularly, in this preferred embodiment, the method for adhering the first contacting surface 121 of the supporting member 12 to the first surface 111 of the body 11 is not limited. For example, the adhesion can be performed by a method such as adhesion with an adhesive, ultrasonic welding, heat welding, and adhesion with a double-sided tape. Specifically, the adhesion can be performed as long as the water-proof capability, the dust-proof capability, the sound transmittance capability, and the air-permeability provided by the asymmetric porous structure 113 of the body 11 remain intact and the combination between the body 11 and the supporting member 12 is firm enough to ensure the desired supporting strength and water pressure resistance of the body 11.

The water-proof and dust-proof membrane assembly 10 can be configured according to the product it applies to, and can be a round membrane, a polygonal membrane, or even a membrane with an irregular shape, without limitation. In addition to the changeable configuration, the water-proof and dust-proof membrane assembly 10 can have the body 11 and the supporting member 12 dyed so as to provide a look harmonious or contrasting to the product where the water-proof and dust-proof membrane assembly 10 is applied, thereby improving esthetic effect of the product. The timing and color for dyeing are not limited herein. For example, the body 11 and the supporting member 12 can be dyed together or successively during or after manufacturing thereof. Colors for dyeing can be used include, but are not limited to, black, green, yellow, blue, red, pink and orange.

Figure 2:
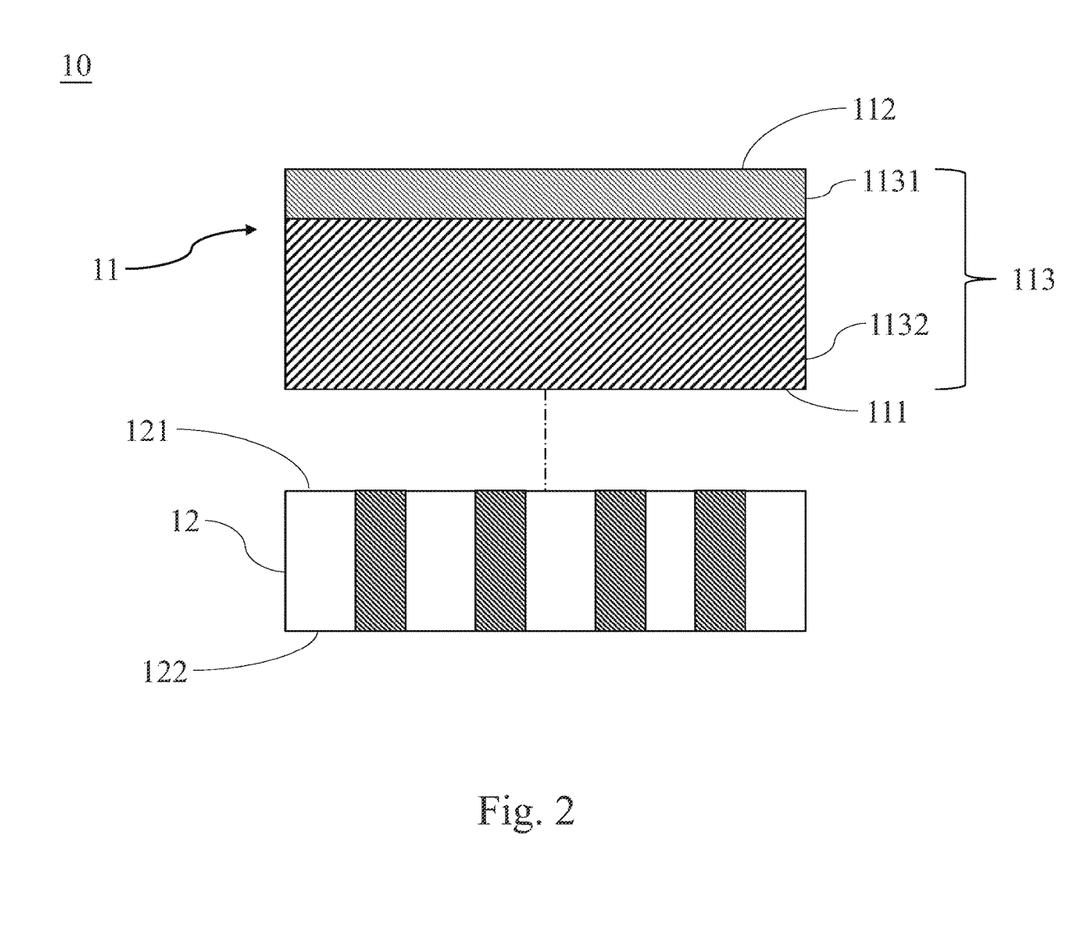
FIG. 2 is a cross-sectional view of a water-proof and dust-proof membrane assembly according to the second preferred embodiment of the present invention.

Please refer to FIG. 2. The second preferred embodiment of the present invention is a water-proof and dust-proof membrane assembly 10. As compared with first preferred embodiment, the first surface 111 of the body 11 of the second preferred embodiment is on the normal portion 1132, rather the dense portion 1131, of the asymmetric porous structure 113. Specifically, when the first contacting surface 121 of the supporting member 12 is adhered to the first surface 111 of the body 11, wherein the first surface 111 of the body 11 is on the normal portion 1132 of the asymmetric porous structure 113, the water-proof and dust-proof membrane assembly 10 has a water-proofness value greater than 9000 mmH$_2$O and has an air-permeability value ranging between 0.1 and 0.25 cm$^3$/cm$^2$ sec. Besides, such water-proof and dust-proof membrane assembly 10 has Gurley number value ranging between 14.8 and 30.5 sec/100 ml. It should be noted that, as compared with first preferred embodiment, except for the first surface 111 of the body 11 of the second preferred embodiment is on the normal portion 1132, all other features and characteristics of the body 11 and the supporting member 12 are substantially the same as those described in the first preferred embodiment.

For further illustrating an electronic device having either the water-proof and dust-proof membrane assembly 10 of the first preferred embodiment or the water-proof and dust-proof membrane assembly 10 of the second preferred embodiment of the present invention, a third preferred embodiment of the present invention is herein provided as a cell phone 20.

Figure 3A:
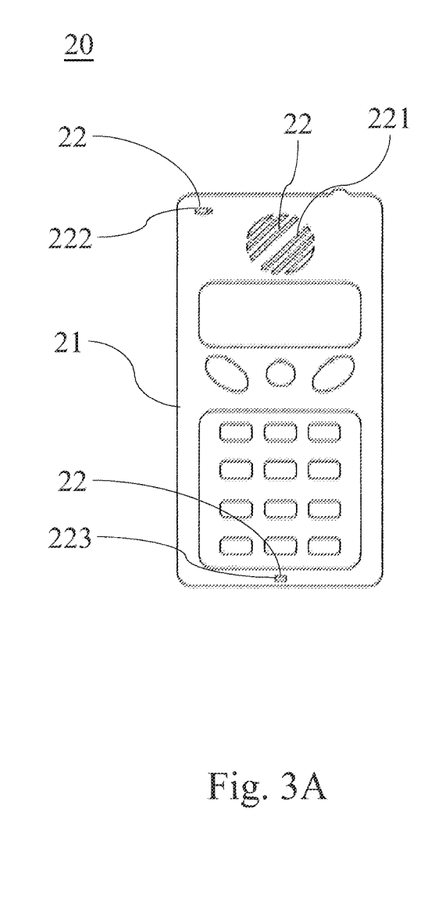
FIG. 3A is a schematic view of an electronic device according to the third preferred embodiment of the present invention, which shows a cell phone having a water-proof and dust-proof membrane assembly.
Figure 3B:
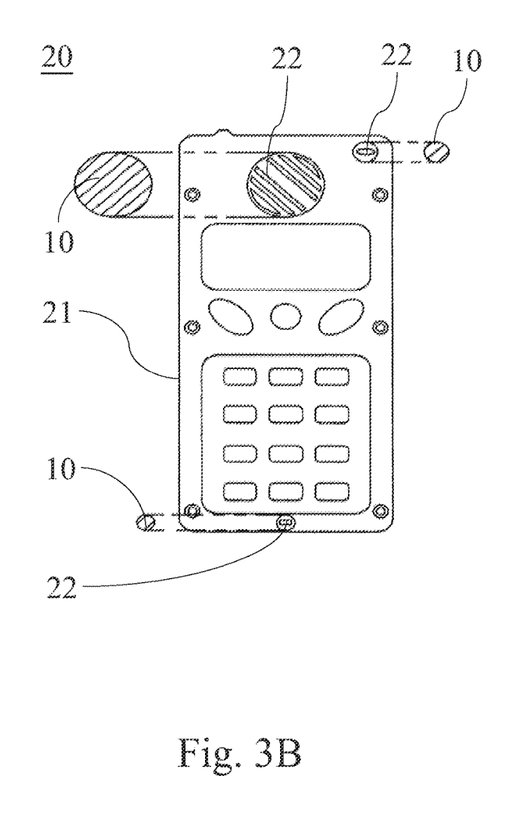
FIG. 3B is a schematic view of an electronic device according to the third preferred embodiment of the present invention, which shows a cell phone having a water-proof and dust-proof membrane assembly.

Please refer to FIG. 3A and FIG. 3B. The third preferred embodiment of the present invention is a cell phone 20 having a water-proof and dust-proof membrane assembly 10. The cell phone 20, which is an electronic device, comprises a housing 21 and a water-proof and dust-proof membrane assembly 10, wherein the water-proof and dust-proof membrane assembly 10 possesses the same features as those described in either the first preferred embodiment of the present invention or the second preferred embodiment of the present invention. Specifically, FIG. 3A is a front view of the housing 21 of the cell phone 20 and FIG. 3B is a disassembled view which shows the interior of the housing 21 of the cell phone 20. The housing 21 has at least one opening 22 and at least one electronic circuit module (not shown). The electronic circuit module (not shown) is deposited inside the housing 21 of the cell phone 20 and is aligned with the position corresponding to the opening 22 of the housing 21. The aforementioned opening 22, which includes a handset 221, a speaker 222 and a microphone 223, is used for sound transmission. The water-proof and dust-proof membrane assembly 10 either of the first preferred embodiment or of the second preferred embodiment is disposed at the opening 22 of the housing 21 so as to prevent moisture, saline matters or any liquid from entering the housing 21 through the opening 22, thereby protecting the electronic circuit module (not shown) in the housing 21 and improving the service life of the cell phone 20.

Moreover, for further illustrating another electronic device having either the water-proof and dust-proof membrane assembly 10 of the first preferred embodiment or the water-proof and dust-proof membrane assembly 10 of the second preferred embodiment of the present invention, a fourth preferred embodiment of the present invention is herein provided as an underwater digital camera 30.

Figure 4:
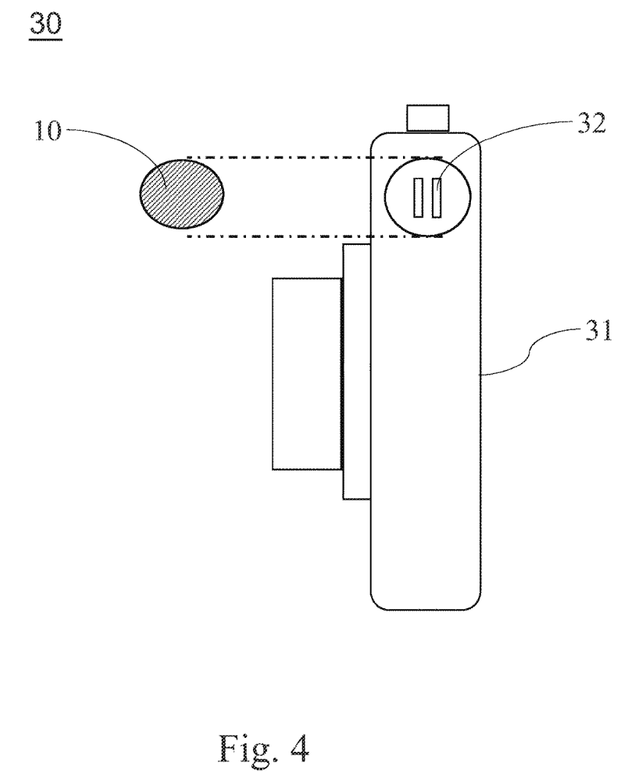
FIG. 4 is a schematic view of an electronic device according to the fourth preferred embodiment of the present invention, which shows an underwater digital camera having a water-proof and dust-proof membrane assembly.

Please refer to FIG. 4. The fourth preferred embodiment of the present invention is an underwater digital camera 30 having a water-proof and dust-proof membrane assembly 10. The underwater digital camera 30, which is an electronic device, comprises a housing 31 and a water-proof and dust-proof membrane assembly 10, wherein the water-proof and dust-proof membrane assembly 10 possesses the same features as those described in either the first preferred embodiment of the present invention or the second preferred embodiment of the present invention. The housing 31 has at least one opening 32 and at least one electronic circuit module (not shown). The electronic circuit module (not shown) is deposited inside the housing 31 of the underwater digital camera 30 and is aligned with the position corresponding to the opening 32 of the housing 31. The aforementioned opening 32 is used for sound transmission while videoing or for acting as a microphone. For the underwater digital camera 30, the qualities of sound transmission during videoing as well as the water-proof capability are important. Accordingly, the water-proof and dust-proof membrane assembly 10 either of the first preferred embodiment or of the second preferred embodiment is disposed at the opening 32 of the underwater digital camera 30. In virtue of the excellent water-proof capability, dust-proof capability, sound transmittance capability, air-permeability, and water pressure resistance of the aforementioned water-proof and dust-proof membrane assembly 10, when the underwater digital camera 30 is operated underwater, water and moisture are prevented from entering the housing 31 through the opening 32. Consequently, the underwater digital camera 30 has prolonged service life and improved sound transmission.

Figure 5:
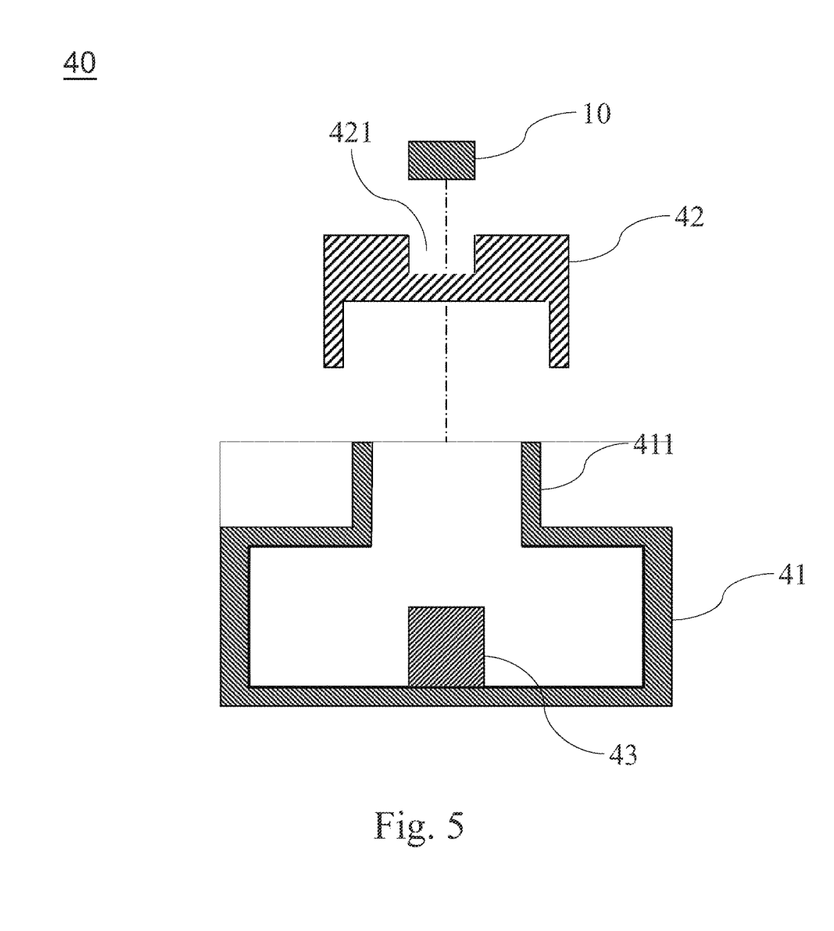
FIG. 5 is a cross-sectional view of a lamp apparatus having a water-proof and dust-proof membrane assembly according to the fifth preferred embodiment of the present invention.

Please refer to FIG. 5. The fifth preferred embodiment of the present invention is a lamp apparatus 40 having a water-proof and dust-proof membrane assembly 10. The lamp apparatus 40 comprises a hollow housing 41 having a window 411, a cover 42, at least one light source device 43, and a water-proof and dust-proof membrane assembly 10. The cover 42 has at least one opening 421. In addition, the cover 42 is configured to engage the window 411 of the hollow housing 41. The light source device 43 comprising at least one light-emitting diode (not shown) is deposited inside the hollow housing 41 of the lamp apparatus 40 and is aligned with the position corresponding to the opening 421 of the cover 42. The water-proof and dust-proof membrane assembly 10 either of the first preferred embodiment or of the second preferred embodiment is disposed at the opening 421 of the cover 42. Specifically, the water-proof and dust-proof membrane assembly 10 of the fifth preferred embodiment possesses the same features as those described in either the first preferred embodiment of the present invention or the second preferred embodiment of the present invention. Due to the excellent water-proof capability, dust-proof capability, and air-permeability of the aforementioned water-proof and dust-proof membrane assembly 10, the water-proof and dust-proof membrane assembly 10 allows water vapor to freely come in and go out the lamp apparatus 40 through the opening 421 of the cover 42, thereby rapidly removing and reducing the build-up of condensation on the interior of the hollow housing 41 of the lamp apparatus 40. Additionally, the water-proof and dust-proof membrane assembly 10 disposed at the opening 421 of the cover 42 is able to accelerate the removal of condensation from the interior of the hollow housing 41 of the lamp apparatus 40 while providing protection from entry of foreign materials and liquid water.

Figure 6:
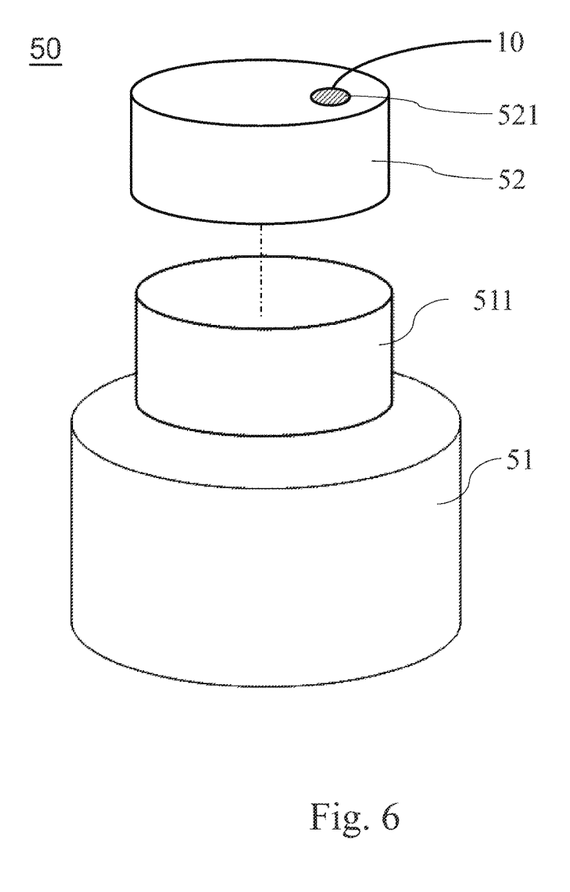
FIG. 6 is a schematic view of a container having a water-proof and dust-proof membrane assembly according to the sixth preferred embodiment of the present invention.

Please refer to FIG. 6. The sixth preferred embodiment of the present invention is a container 50 having a water-proof and dust-proof membrane assembly 10. The container 50 comprises a hollow housing 51 having a window 511, a cap 52, and a water-proof and dust-proof membrane assembly 10. The cap 52 has at least one opening 521. In addition, the cap 52 is configured to engage the window 511 of the hollow housing 51. The water-proof and dust-proof membrane assembly 10 either of the first preferred embodiment or of the second preferred embodiment is disposed at the opening 521 of the cap 52. Specifically, the water-proof and dust-proof membrane assembly 10 of the sixth preferred embodiment possesses the same features as those described in either the first preferred embodiment of the present invention or the second preferred embodiment of the present invention. When the cap 52 is configured to engage the window 511 of the hollow housing 51, the water-proof and dust-proof membrane assembly 10 can effectively balance pressures inside and outside the container 50 having the water-proof and dust-proof membrane assembly 10. Due to the excellent water-proof capability, dust-proof capability, and air-permeability of the aforementioned water-proof and dust-proof membrane assembly 10, the water-proof and dust-proof membrane assembly 10 allows water vapor to freely come in and go out the container 50 through the opening 521 of the cap 52, thereby rapidly removing and reducing the build-up of condensation on the interior of the hollow housing 51 of the container 50 and thus securing the interior of the container 50 from damp.

To further demonstrating how the air-permeability and sound transmission loss of the water-proof and dust-proof membrane assembly 10 of the present invention changed after processed by the aforementioned stretching shaping method, two examples are provided below.

The water-proof and dust-proof membrane assembly 10 was made into two formats titled as Example A and Example B, respectively. Particularly, the water-proof and dust-proof membrane assembly 10 of Example A was the same as that depicted in FIG. 1 and recited in the first preferred embodiment, that was to say, the first contacting surface 121 of the supporting member 12 was adhered to the first surface 111 of the body 11, wherein the first surface 111 of the body 11 was on the dense portion 1131 of the asymmetric porous structure 113. In addition, the water-proof and dust-proof membrane assembly 10 of Example B was the same as that depicted in FIG. 2 and recited in the second preferred embodiment, that was to say, the first contacting surface 121 of the supporting member 12 was adhered to the first surface 111 of the body 11, wherein the first surface 111 of the body 11 was on the normal portion 1132 of the asymmetric porous structure 113.

In brief, the air-permeability and the sound transmission loss of each example of the water-proof and dust-proof membrane assembly 10 were measured according to ASTM D-726 and IEEE 269-1992, respectively. During the measurement, ten samples of Example A and ten samples of Example B were respectively tested, and the performances of Example A and Example B were determined by mean values of ten measurement results, respectively. The results are shown in Table 1.

TABLE 1

|  | Example A | Example B |
|---|---|---|
| Gurley Number* (sec/100 ml) | 0.3 | 14.8 |
| Air-Permeability* ($cm^3/cm^2/sec$) | 4.5 | 0.124 |
| Water-Proofness* ($mmH_2O$) | 2600 | 11000 |
| Sound transmission loss* (dB) | 2.6 | 1.4 |

*Represents the mean value of ten measurement results

Example A

Table 1 shows that the water-proof and dust-proof membrane assembly 10 of Example A has a Gurley number value of 0.3 sec/100 ml, an air-permeability value of 4.50 $cm^3/cm^2/sec$, a water-proofness value of 2600 $mmH_2O$, and a sound transmission loss of 2.6 dB at the frequency ranging from 500 to 5000 Hz. Since the water-proof and dust-proof membrane assembly 10 of Example A is intended to be applied in the non-electronic product, such as that recited in the above-mentioned fifth and sixth preferred embodiment, excellent air-permeability should be provided in order to remove and reduce the build-up of condensation in the non-electronic product.

Example B

Table 1 shows that the water-proof and dust-proof membrane assembly 10 of Example B has a Gurley number value of 14.8 sec/100 ml, an air-permeability value of 0.124 $cm^3/cm^2/sec$, a water-proofness value of 11000 $mmH_2O$, and a sound transmission loss of 1.4 dB at the frequency ranging from 500 to 5000 Hz. The water-proof and dust-proof membrane assembly 10 of Example B could be used in normal consumer electronic products, such as that recited in the above-mentioned third preferred embodiment, and seemed more adaptive to underwater electronic products, such as that recited in the above-mentioned fourth preferred embodiment.

More particularly, the water-proof and dust-proof membrane assembly 10 either of the first preferred embodiment or of the second preferred embodiment of the present invention, with satisfactory water-proof capability, dust-proof capability, sound transmittance capability, air-permeability, and water pressure resistance, is widely applicable to, for instance, normal consumer electronic products, underwater electronic products, and non-electronic products.

Examples of the normal consumer electronic products where the water-proof and dust-proof membrane assembly 10 can be used include digital cameras, cell phones, microphones, earphones, speakers, walky-talkies, alarm horns, e-books, and automotive back-up radars, wherein these normal consumer electronic products have excellent water-proof capability, dust-proof capability, sound transmittance capability, and air-permeability provided by the water-proof and dust-proof membrane assembly 10 that is applied thereon.

In addition, examples of the underwater electronic products where the water-proof and dust-proof membrane assembly 10 is adaptive can refer to underwater digital cameras as that recited in the fourth preferred embodiment, underwater MP3s, and underwater watches where superior water-proof capability, dust-proof capability, sound transmittance capability, and air-permeability are required.

Furthermore, examples of the products, including outdoor lighting devices, vehicle lamps, LED lighting devices, gas detectors, and petri dishes (non-electronic products), where the water-proof and dust-proof membrane assembly 10 can be used. Specifically, these products have excellent water-proof capability, dust-proof capability, air-permeability, and fog-proof capability provided by the water-proof and dust-proof membrane assembly 10 that is applied thereon.

Moreover, examples of the products, including projectors, ink cartridges, lithium battery boxes, solar cell junction boxes, and containers (non-electronic products), where the water-proof and dust-proof membrane assembly 10 can be used. Specifically, these products have excellent water-proof capability, dust-proof capability, air-permeability provided by the water-proof and dust-proof membrane assembly 10 that is applied thereon. Besides, the water-proof and dust-proof membrane assembly 10 can effectively balance pressures inside and outside of these products.

Moreover, examples of the products, including water-proof adapters, global positioning systems, industrial computer casings, electronic notebooks, medical electronic devices and military electronic devices, where the water-proof and dust-proof membrane assembly 10 can be used. Specifically, these products have excellent water-proof capability, dust-proof capability, air-permeability provided by the water-proof and dust-proof membrane assembly 10 that is applied thereon.

Although some particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. A water-proof and dust-proof membrane assembly, comprising:
    a body comprising:
        an expanded porous polytetrafluoroethylene in form of membrane, wherein said expanded porous polytetrafluoroethylene consists of a homopolymer of tetrafluoroethylene monomer;
        a first surface;
        a second surface; and an asymmetric porous structure formed between said first surface and said second surface of said body,
wherein said asymmetric porous structure having a thickness ranging between 200 μm and 1000 μm, a plurality of pores with a first volumetric porosity, each pore has a pore diameter between 5 μm and 15 μm, wherein said asymmetric porous structure further comprises a dense portion and a normal portion integrally formed with said dense portion, wherein said dense portion is 0.04% to 40% of the thickness, wherein said dense portion has a water contact angle ranging between 120° and 135°, and wherein said asymmetric porous structure providing a maximum air-permeability value of 5.8 cm$^3$/cm$^2$ sec; and
a supporting member being made of a polymeric material and comprising:
 a first contacting surface;
 a second contacting surface; and
 a second volumetric porosity ranging between 10% to 99.9%;
wherein said first contacting surface is adhered to said first surface of said body via heat welding and said second volumetric porosity is greater than and subject to said first volumetric porosity, and
wherein said supporting member enhancing the overall supporting strength and water pressure resistance of said water-proof and dust-proof membrane assembly and increasing the water-proofness value to be greater than 9000 mmH$_2$O to 11000 mmH$_2$O without affecting the sound transmittance capability with a minimum sound transmittance loss value of 1.4 dB.

2. The water-proof and dust-proof membrane assembly of claim 1, wherein said first volumetric porosity of said asymmetric porous structure is between 5% and 10%.

3. The water-proof and dust-proof membrane assembly of claim 1, wherein said first volumetric porosity of said asymmetric porous structure is between 80% and 99%.

* * * * *